United States Patent
Dietzel et al.

(10) Patent No.: US 6,297,630 B1
(45) Date of Patent: Oct. 2, 2001

(54) METHOD AND DEVICE FOR MEASURING THE DISTRIBUTION OF MAGNETIC FIELDS

(75) Inventors: Andreas Dietzel, Wallertheim; Friedrich Fleischmann, Erlangen, both of (DE)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/263,695

(22) Filed: Mar. 5, 1999

(30) Foreign Application Priority Data

May 19, 1998 (DE) .............................................. 197 55 534

(51) Int. Cl.$^7$ .......................... G01R 33/09; G01R 33/10; G01R 33/12
(52) U.S. Cl. ........................ 324/210; 324/247; 324/252; 324/261
(58) Field of Search .................................. 324/250, 249, 324/210, 252, 211, 212, 213, 244, 247; 360/313, 75

(56) References Cited

U.S. PATENT DOCUMENTS 5,075,623 * 12/1991 Matsuda et al. ..................... 324/250

OTHER PUBLICATIONS

J.H.J. Fluitman, "Recording Head Field Measurement with a Magnetoresistive Transducer," IEEE Transactions on Magnetics, vol. MAG–14, No. 5, pp. 433–435, Sep. 1978.*

* cited by examiner

Primary Examiner—Hezron Williams
Assistant Examiner—Henry S. Andersen
(74) Attorney, Agent, or Firm—Casey P. August; McGinn & Gibb, PLLC

(57) ABSTRACT

A process permits the determination of multi-dimensional distribution of magnetic fields. The process uses a magnetoresistive sensor as a physical measuring device. The measuring device is coupled with a method for algebraic reconstruction so that sectional images of the field distribution are calculated from individual measurements of the magnetoresistive effect using the algebraic reconstruction.

20 Claims, 1 Drawing Sheet

METHOD AND DEVICE FOR MEASURING THE DISTRIBUTION OF MAGNETIC FIELDS

BACKGROUND OF THE INVENTION

The present invention relates to a method for determining the distribution of magnetic fields in multi-dimensional space. In particular, the invention relates to the measurement of such fields in read/write heads for magnetic storage media. The invention also relates to a device for carrying out said method.

With the continuously increasing recording density and the continual improvement in quality in the development of magnetic heads in recent years it has become ever more important to be able to measure the multi-dimensional spatial distribution of a magnetic field as accurately as possible, since this distribution in the vicinity of the gap in a magnetic head represents a factor which has a profound influence on the recording and/or playback properties.

If a magnetic head is guided over a magnetic recording medium, for example, a magnetic disk, carrying a magnetic thin film layer, then a magnetization which lies in the micron or submicron region will be produced in the magnetic layer of the disk. As a result of the increasing write density on the disk the gap between neighboring tracks is becoming ever narrower. It is therefore important that the magnetization always remains sharply contoured and, for example, does not extend into neighboring tracks, since this could lead to write or read errors.

It is therefore important to be able to analyze or measure the distribution of the magnetic field as accurately as possible, in order to avoid such write or read errors. For this purpose it is particularly advantageous if such a characterization can already be effected beforehand, i.e. in the manufacture of a magnetic head, and not in a separate test only after manufacture.

J. H. J. Fluitman, "Recording Head Field Measurement with a Magnetoresistive Transducer", Transactions on Magnetics, Vol. 4, No. 5, September 1978; pages 433–435, describes the measurement of field distributions of magnetic heads with a magneto resistive (MR) element in the form of a one-dimensional scan process of the MR element in the direction of its short axis and subsequent calculation of the MR signal output.

"So-called electron beam tomography, in which the field distribution is reconstructed three-dimensionally by the tomography method (tomography stands for the determination of a split image by means of an algebraic reconstruction starting from measured values, which represent the material or spatial properties along a measuring beam), where the starting point is the magnitude of the deviation of an electron beam because of the action of the Lorentz force of the magnetic field on the electron beam after passing through the magnetic field, has recently been proposed as one method for measuring the magnetic field distribution in the micron region. An application of a computer simulation then leads to a simple model of the magnetic field distribution (cf. "Evaluation of Three-Dimensional Micromagntic Stray Fields by Means of Electron-Beam Tomography", IEEE Trans. Magn., MAG-21, 5, pages 1593,1594 (1985))."

J. P. J. Groenland et al., "Measurement System for Two-Dimensional Magnetic Field Distributions, Applied to the Investigation of Recording Head Fields", J. Phys. E: Sci. Instrum., Vol. 14, 1981, p.503 ff, describes the measurement of the magnetic field distribution of a magnetic head with the aid of a magneto resistive sensor. Here, however, no attempt was made to determine the field distribution directly from the measured values obtained, but simulations were calculated with the aid of which the measurements could then be interpreted.

In U.S. Pat. No. 5,075,623 a method is described for high precision measurement of the three-dimensional spatial distribution of magnetic fields, which connects the deflection of an electron beam in the magnetic field (Lorentz force) with the algebraic reconstruction method. The method is characterized by: (a) a reference axis, in which the magnetic field distribution is measured and several planes vertical to it selected, (b) an electron beam in any one of these planes to be measured is scanned at predetermined angles of incidence and the magnitude of the deviation of the electron beam subsequently measured on the basis of the Lorentz force, (c) an algebraic reconstruction of the magnetic field distribution in any of the planes carried out on the basis of the corresponding. measured deviation, (d) the flight path of the electron beam calculated to obtain a deviation value, which corresponds to any of the successively measured deviations, (e) the differences of the calculated deviations of the electron beam from the corresponding measured deviation calculated and (f) the reconstructed magnetic field corrected on the basis of this difference, until the difference falls below a pre-determined value.

SUMMARY OF THE INVENTION

A disadvantage of the state of the art methods is that, to some extent, they do not permit determination of the multi-dimensional distribution of the magnetic field and, in addition, they are very time-consuming and expensive. Thus the electron beam method requires the use of a vacuum chamber, leading to high equipment expenditure and greatly increased costs. In addition, the characterization of, for example, magnetic heads is very difficult, since it is not possible to obtain a high throughput with the apparatus mentioned because of the necessity to charge up the part to be measured in the vacuum chamber and to discharge it again. In addition, with this method the specimen to be measured is always between a transmitter and a receiver, where the gap is measured in cm, which is a disadvantage particularly where the specimen has a pronounced topography, since the electron beam frequently cannot be detected by the receiver because of shielding by the specimen itself.

It is therefore an object of the present invention to provide a method for the determination of multi-dimensional distribution of a magnetic field which will allow the distribution of a magnetic field to be determined in an economic manner without the need for expensive equipment.

It is a further object to provide a method of said type with which a satisfactory result can be obtained even in the case where the specimen to be measured has a pronounced topography.

This and other objects are achieved by a method for the determination of the multi-dimensional distribution of a magnetic field in accordance with claim 1 and the device in accordance with claim 10.

Further advantageous embodiments of the method and device in accordance with the invention are set out in the sub-claims.

Although the present invention is generally applicable where magnetic fields extend over microscopic dimensions (i.e., in the millimeter down to nanometer range), for example, in the case of circuits with small track separations, it will hereinafter be described in more detail in relation to the determination of the distribution of magnetic fields in the case of read/write heads.

The method in accordance with the invention permits the multi-dimensional distribution of magnetic fields to be determined simply and economically, particularly in the case of magnetic heads. The determination can be carried out without expensive equipment and makes it possible to characterize the magnetic fields even during manufacture, so that a preliminary forecast of subsequent performance can be made. Because,of the simplicity of the arrangement a substantial throughput can be achieved and accurate results obtained even in the case of specimens which are difficult to characterize on account of a complex topography.

BRIEF DESCRIPTION OF THE DRAWINGS

The foregoing and other purposes, aspects and advantages will be better understood from the following detailed description of the invention with reference to the drawings, in which.

DETAILED DESCRIPTION OF THE INVENTION

Figure 1:
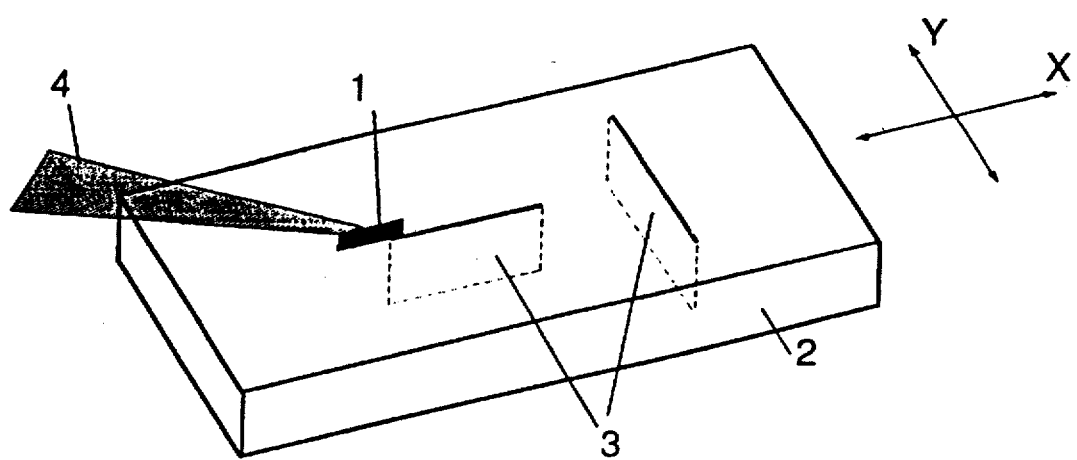
FIG. 1 illustrates a device for performing a method for determining the distribution of multidimensional magnetic fields according to the present invention.

The present invention combines the principle of the magneto resistive effect with the algebraic reconstruction method in order to allow a measurement of the multi-dimensional distribution of the magnetic field. By magneto resistive (MR) effect is to be understood the change in electrical resistance because of penetration through a magnetic field. Modern MR sensors are produced using an optimized multi-layer thin film technology. A further development of the MR effect is the giant magneto resistive (GMR) effect, which causes a very much greater change of conductivity and hence allows even more sensitive magnetic field measurements.

For measuring the field distribution in accordance with the present invention a magneto resistive sensor is used. The magneto resistive sensor consists of a thin filmwith one edge as magnetic field entry window. For this reason the sensor integrates the magnetic field along its x,y dimensions of-the entry surface. For measurement, a thin film is preferably used, similar or for practical reasons even identical to the multi-layer film used in the manufacture of the read element. The invention is, however, not limited to this embodiment, but any desired thin-film magneto resistive element may be employed. The extension of the film used is preferably within the range 1–100 μm. This makes it possible to "immerse" the measuring strip, i.e. the MR sensor, in the case of extreme topographies. This makes it possible to measure field distributions even over convex specimen geometries.

To measure the field distribution, a distance from the object producing the magnetic field at which the measurement is to be made (z-axis) is first established. Here a certain x,y plane is therefore selected in which the measurement is to be made. This is important, since the magnitude of the magnetic field decreases in non-linear fashion with distance from the element producing the magnetic field. One possibility, for example, is to make the measurement in contact with the specimen. This has the advantage that the distance 0 is best defined and that the field produced is here at a maximum. In measuring the field distribution of a magnetic head it is, for example, sensible to make the measurement at the height at which the head will subsequently float above the magnetic disk, in order to measure precisely the field which will later apply in situ on the disk surface, i.e. where the magnetizable coating is located, while it seems rational in applying the invention to electrical circuits to select the distance between adjacent conductors.

Finally, the MR sensor (thin film) is guided over the measurement region in such a direction that the scan direction is perpendicular to the long axis of the sensor, in order to achieve a coverage of the measurement field with measuring beams. In this case, the corresponding signals are recorded and displayed during the scanning. The scanning can be at any desired resolution in suitably sized steps.

The measurement field is then scanned at a given angle to the first scan direction, likewise with recording and display of the corresponding signals. In one particular embodiment of the invention this second scanning process may be carried out with the aid of a second thin film arranged at the desired angle to the firstsensor. If two separate sensors are used, these can, for example, be disposed at an angle of 90°. In this case it is possible to employ, for example, two MR read heads embedded in epoxy resin which have a smooth polished surface on which the magnetic head to be analysed can slide in two directions. Here care must be taken to obtain a correct overlap of the scan positions for the two MR sensors. This will ensure that the "rows and columns" of this scanning process can be accurately superimposed in the reconstruction.

Such a device is shown diagrammatically in FIG. 1. The element 1 producing the magnetic field, in the present case a magnetic head suspended on a hanger 4, is in contact with a measuring plate 2 in which two MR sensors 3 are embedded. The sensors are in a fixed arrangement and form a right-angle with one another. The measuring panel can only be moved in the x,y direction, so that the magnetic head is "scanned". Naturally, the magnetic head can, as mentioned above, also be arranged at a fixed position above the plate.

It is to be understood that more than two sensors. may be employed and are then arranged at a pre-determined angle to one another. The consequential additional technological expenditure for the system could be justified, for example, in the case of applications demanding high image quality.

A further significant advantage of the method lies in the possible combination with other methods, such as, for example, raster scan microscope methods (scan force microscope), if the sensors at right-angles to one another are realized on a micro beam. In this way the measurement results can be meaningfully complemented.

Figure 2:
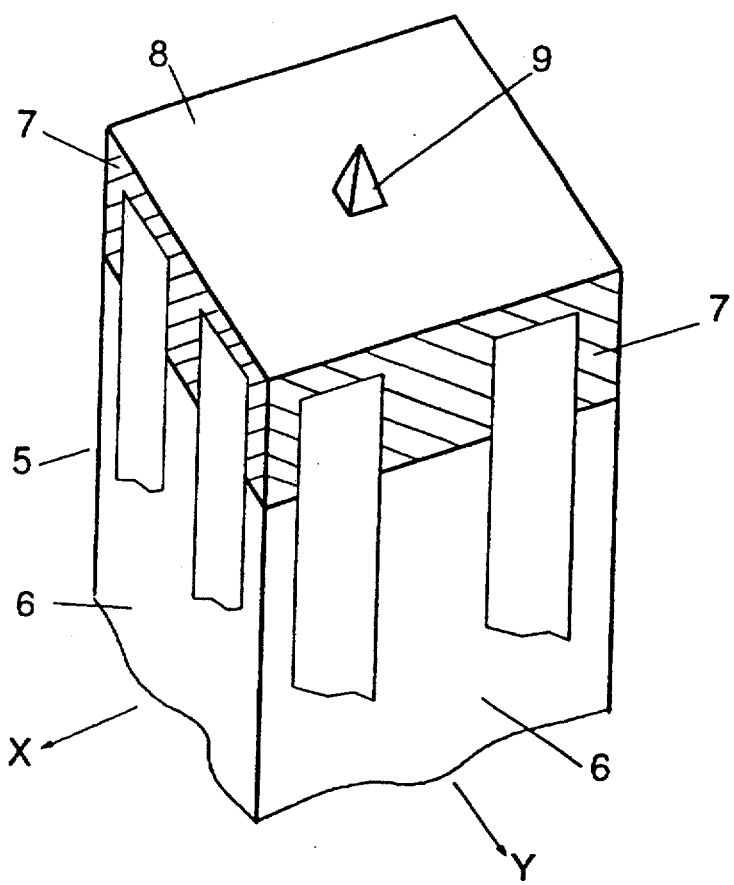
FIG. 2 illustrates a device for performing a method for determining the distribution of multidimensional magnetic fields and having a columnar structure according to the present invention.

Such an arrangement is shown diagrammatically in FIG. 2. A micromechanical design of a columnar structure 5 with smooth edge faces 6 (micro beam) carries on these edge faces magneto resistive layers 7, which serve as sensors in the x and/or y directions. The columnar structure, which may, for example, be formed of lithographically structured silicon, can now be moved in the x and y directions, as a consequence of which the magnetic head is again scanned. On the front surface g of the column pointing to the magnetic head to be examined a peak 9, which can also serve as the raster scan peak, can, under certain circumstances, be attached.

A further embodiment of the invention comprises the scanning of the measurement field with only one sensor, which is aligned to the appropriate angle before each separate scanning operation.

The next step of the method in accordance with the invention now consists in the algebraic reconstruction of the measuring field.

The dimension in the y direction is normally wider by an order of magnitude than the dimension in the x direction (film thickness). For this reason, the determination of the field distribution can be considered analogous to the image reconstruction in x-ray computer tomography, in which the signal integration along the x-ray beam runs from the x-ray source to the detector. In order to be able to obtain a two-dimensional radiograph, the source-detector axis is rotated and the signal measured as a function of the angle of rotation (0–360°).

The field is now divided into N×N pixels P_uv (P_uv represents the point of the split image to be found in column u and row v):

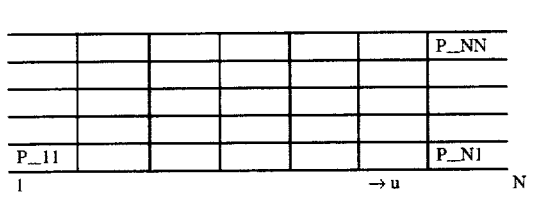

In this way the measurement signal S, which represents a linear integral along the long axis of the sensor, can be represented as a finite sum. The reconstruction of the field distribution is then equivalent to the problem of solving a system with 2N equations:

$$S\_u = SUM\_v\ (P\_uv);\ v=1\ldots N$$

$$S\_v = SUM\_u\ (P\_uv);\ u=1\ldots N,$$

where S_u represents the signal output of the MR element with the long axis in the x-direction. Correspondingly, S_v represents the signal output in the y-direction. Such a calculation can be carried out very easily with the help of a PC as an iterative approximation. In this way a two-dimensional distribution of the magnetic field is obtained.

To establish the three-dimensional distribution of the magnetic field, a new plane for the measurement can now be established and the above-referenced steps thereafter repeated. In this way the entire three-dimensional distribution can be determined.

For the determination of the magnetic field distribution with magnetic write heads, a two-dimensional measurement at the plane of the magnetic disk, i.e. at the floating height, is sometimes adequate. In this case, a single measurement will suffice to determine the distribution.

By means of the present invention it is possible, in a simple manner, to measure both two and three-dimensional distributions of magnetic fields. The results of the measurements are obtained directly, that is, without further additional corrections (such as, for example, for a bending of the measuring beam resulting from the deflection of an electron beam in the case of electron beam tomography). Thus a well-defined field distribution can be reconstructed rapidly and without additional approximation methods.

What is claimed is:

1. A method for determining a distribution of multi-dimensional magnetic fields produced by a magnetic field producing device, said method comprising:

locating at least one magneto-resistive sensor a first distance from said magnetic field producing device to form a measuring region between said at least one sensor and said magnetic field producing device;

a first scanning of said at least one sensor over said measuring region in one direction, where a first scanning direction is perpendicular to a long axis of said at least one sensor, to first sense a magnetic field;

a second scanning of said at least one sensor over said measuring region at a predetermined angle to said first scanning direction, to second sense said magnetic field; and algebraically reconstructing a distribution of said magnetic field on a basis of signals received from said first scanning and said second scanning.

2. The method in accordance with claim 1, further comprising:

locating said at least one sensor a second distance from said magnetic field producing device which is greater than said first distance; and repeating said first scanning, said second scanning and said algebraically reconstructing a distribution of said magnetic field.

3. The method in accordance with claim 1, wherein said magnetic field producing device comprises a read/write device.

4. The method in accordance with claim 1, wherein said magnetic field producing device comprises a current-carrying conductor.

5. The method in accordance with claim 1, wherein said at least one magneto-resistive sensor comprises a thin film structure.

6. The method in accordance with claim 5, wherein said thin film structure has a same structure as a thin film structure used in a manufacture of a read/write device.

7. The method in accordance with claim 1, wherein said first distance equals zero so that said at least one sensor contacts said magnetic field producing device.

8. The method in accordance with claim 1, wherein said at least one sensor comprises two magneto-resistive sensors arranged at a spatially-fixed angle of 90° to one another.

9. The method in accordance with claim 1, wherein said at least one sensor comprises one magneto-resistive sensor which is aligned by rotating through a pre-determined angle before carrying out said second scanning.

10. A device for carrying out the method in accordance with claim 1, wherein said at least one sensor comprises two magneto-resistive sensors that are arranged in a fixed position at right-angles to one another.

11. The device in accordance with claim 10, wherein said sensors are arranged in a measuring plate.

12. The device in accordance with claim 11, wherein said measuring plate is moveable in a planar direction.

13. The device in accordance with claim 11, wherein said measuring plate comprises an epoxy material.

14. The device in accordance with claim 10, wherein each of said sensors comprise magneto-resistive layers, which are applied to edge faces of a columnar structure.

15. The device in accordance with claim 14, wherein said columnar structure comprises lithographically structured silicon.

16. The device in accordance with claim 14, wherein said columnar structure comprises a grid probe tip on a side facing said magnetic field producing device.

17. The method in accordance with claim 1, wherein said algebraically reconstructing comprises dividing said measuring region into N×N pixels and solving 2N equations which are in part functions of a signal output from said at least one sensor in said first scanning direction and signal output from said at least one sensor in said second scanning direction.

18. The method in accordance with claim 1, wherein a specimen to be measured has a pronounced topography.

19. The method in accordance with claim 5, wherein said thin film structure is sufficiently thin to allow said at least one sensor to be immersed in an extreme topography.

20. The method in accordance with claim 1, wherein said measuring region comprises a planar measuring region.

* * * * *